United States Patent

Lerman

[11] Patent Number: 5,540,339
[45] Date of Patent: Jul. 30, 1996

[54] TELECOMMUNICATIONS WALL RACK

[75] Inventor: Zev Z. Lerman, Chicago, Ill.

[73] Assignee: Homaco, Inc., Chicago, Ill.

[21] Appl. No.: 258,837

[22] Filed: Jun. 13, 1994

[51] Int. Cl.⁶ ............................................. A47F 7/00
[52] U.S. Cl. ................ 211/26; 211/87; 211/169; 248/906; 49/193; 312/293.2; 312/324; 16/381
[58] Field of Search .................. 211/26, 87, 169, 211/189; 312/264, 293.2, 321.5, 324, 223.4; 248/906, 903; 49/193; 411/84, 87, 171; 403/118, 192, 193, 382; 16/316, 381

[56] References Cited

U.S. PATENT DOCUMENTS

| | | | |
|---|---|---|---|
| 684,721 | 10/1901 | Roots | 16/316 X |
| 1,907,073 | 5/1933 | Leighton | 16/381 X |
| 2,443,515 | 6/1948 | Rockwell | 312/324 |
| 3,378,954 | 4/1968 | Sandin | 49/193 |
| 4,553,674 | 11/1985 | Yoshikawa et al. | 211/26 |
| 5,165,770 | 11/1992 | Hahn | 312/265.4 |
| 5,307,942 | 5/1994 | Quelfeter et al. | 211/26 |

FOREIGN PATENT DOCUMENTS

| | | | |
|---|---|---|---|
| 1138521 | 6/1957 | France | 411/87 |
| 838173 | 6/1960 | United Kingdom | 411/171 |
| 1516622 | 7/1978 | United Kingdom | 16/316 |

*Primary Examiner*—Alvin C. Chin-Shue
*Assistant Examiner*—Brian J. Hamilla
*Attorney, Agent, or Firm*—Anthony S. Zummer

[57] ABSTRACT

A telecommunications wall rack is particularly adapted for supporting a plurality of telecommunications panels. The wall rack includes a support frame which is adapted for mounting on a substantially vertical surface. The wall rack includes a mounting frame adapted for supporting a plurality of telecommunications panels. A pair of aligned hinges pivotally connects the mounting frame to the support frame. Each of the hinges has an axis of pivoting substantially aligned with the axis of pivoting of the other hinge of the pair. Each of the hinges has a threaded hinge pin mounted on the support frame. The mounting frame is threadedly connected to each hinge pin for pivoting on the hinge pins. A locking apparatus releasably connects the mounting frame to the support frame to allow selective pivoting of the mounting frame on the threaded hinge pins relative to the support frame to provide access to both sides of the mounting frame.

8 Claims, 3 Drawing Sheets

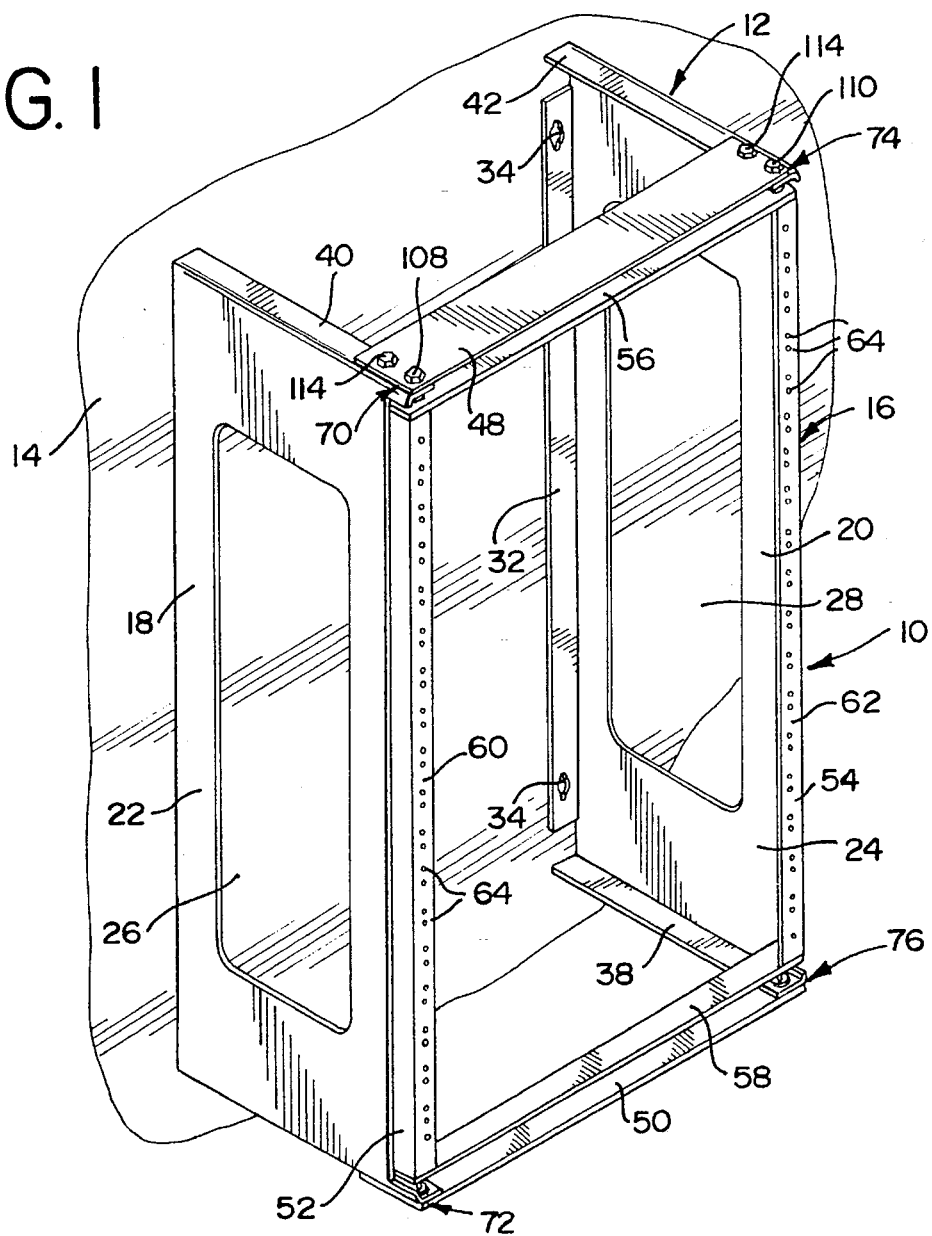
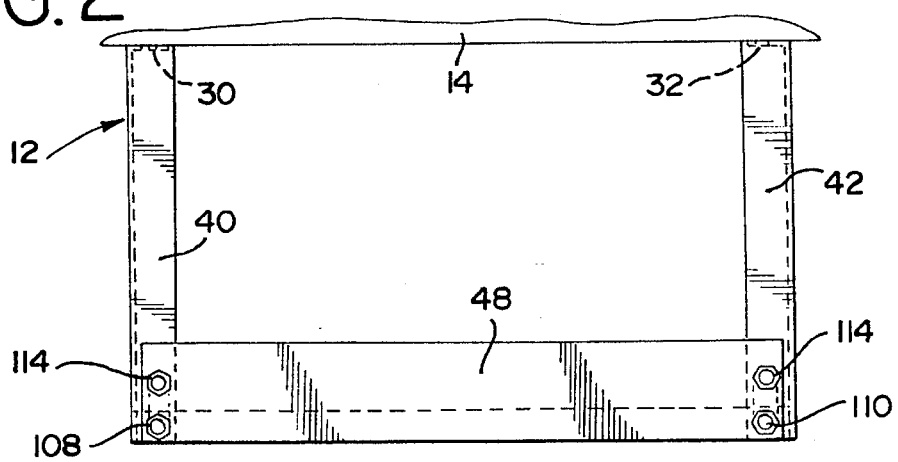

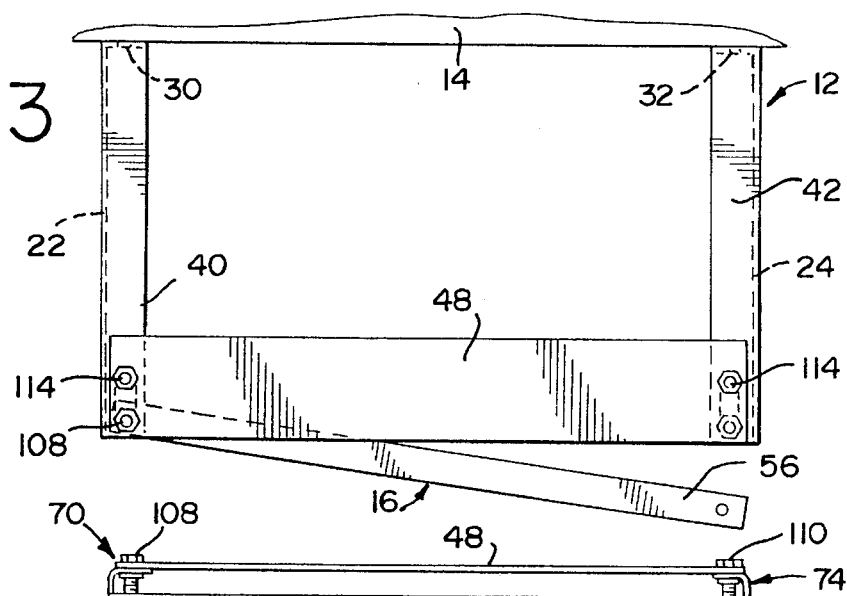
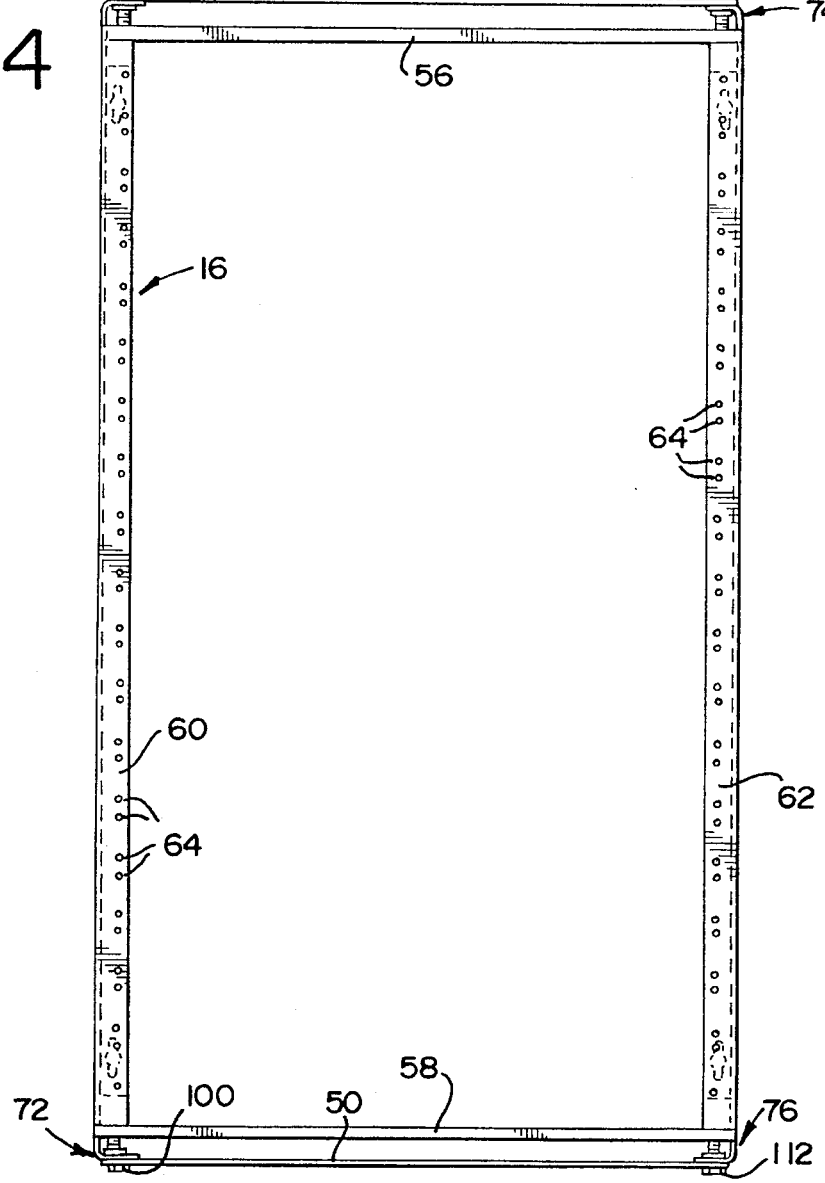

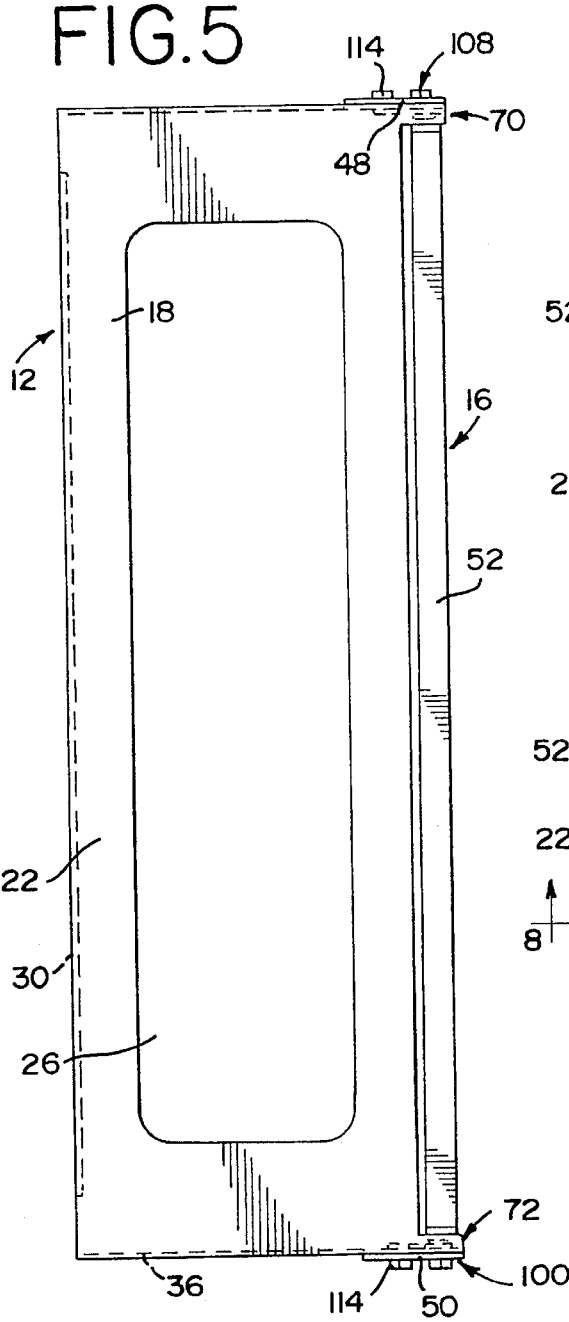
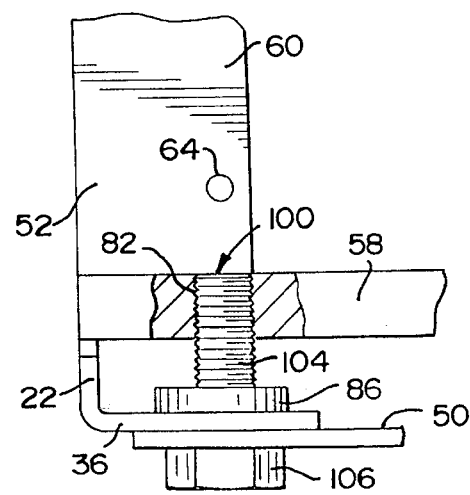
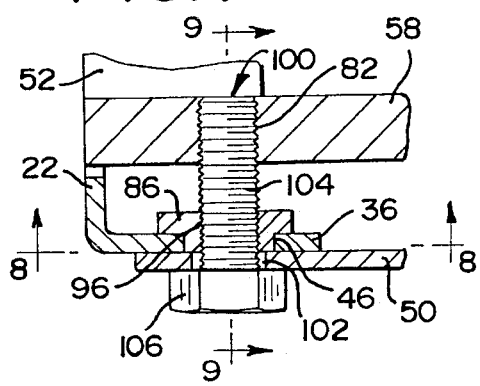
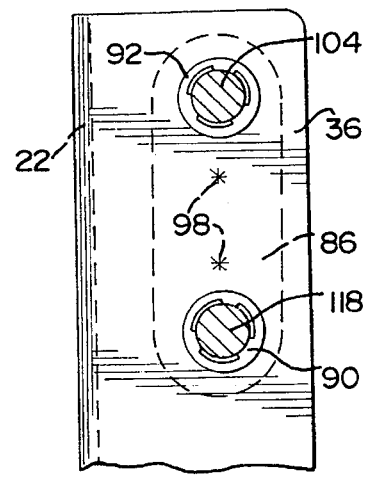
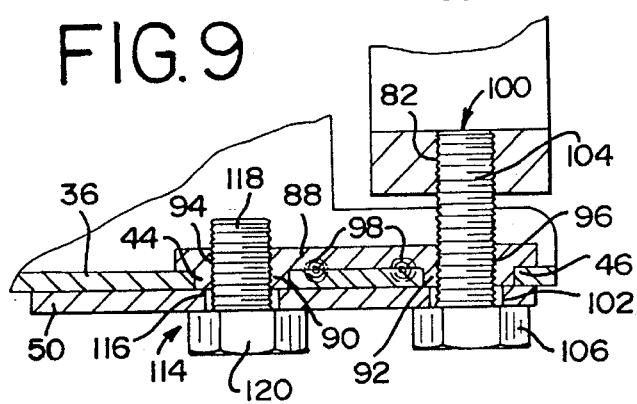

TELECOMMUNICATIONS WALL RACK

BACKGROUND OF THE INVENTION

Wiring and connected hardware are an integral part of a typical commercial building telecommunications wiring system. Wiring standards of Category 5 Transmission, require that items, such as, modular jack panels be mounted for easy installation and service. A typical piece of equipment upon which modular jack panels are mounted is a floor-to-ceiling relay rack. In many installations, a floor-to-ceiling relay rack is not warranted for the number of panels which are to be utilized. A well-known piece of equipment for mounting a smaller number of panels is a wall rack typically mounted on a vertical wall. A wall rack generally includes a support frame which is fixed relative to the wall and a mounting frame connected to the support frame. The mounting frame has a plurality of modular jack panels mounted thereon with the front of the panels exposed. The mounting frame is connected to the support frame by a pair of vertically aligned hinges on one side of the mounting frame and a locking latch on the opposite side of the mounting frame. When it is desired to reach the back of the jack panels, the locking latch is released thereby releasing the one side of the mounting frame from the support frame so that the mounting frame may pivot on the vertically aligned hinges. Whether a wall rack in a given installation is a right or a left opening wall rack is determined when the wall rack is initially mounted on a wall. It is well known to change a wall rack from left to right opening simply by inverting or rotating the rack 180°. However, mounting of panels on the mounting frame fixes the side of the opening of the mounting frame.

It has been found that the mounting frame with the jack panels and wiring mounted thereon is heavy and the frame tends to sag when it is pivoted to allow the back of the panels to be exposed. The sagging is in part due to the clearance between a hinge pin and the member in which it rotates. The sagged mounting frame is difficult to move back into its normal operative position. It is desirable to provide a telecommunication wall rack which opens from either side and has a minimum of sag when the mounting frame is pivoted relative to the support frame.

SUMMARY OF THE INVENTION

A telecommunications wall rack is used for supporting a plurality of telecommunications panels. The wall rack includes a support frame which is particularly adapted for mounting on a substantially vertical surface, such as, a wall. A mounting frame is provided for supporting a plurality of telecommunications panels. The mounting frame is pivotally supported on the support frame by two pairs of aligned hinges, each pair mounted on an opposite side of the mounting frame. Each of the hinges has an axis of pivoting aligned with the axis of pivoting of the other hinge of the pair. Each of the hinges has a threaded hinge pin mounted on the support frame. The mounting frame is threadedly connected to each of the threaded hinge pins to pivot on the threaded hinge pins. One of the pair of aligned hinges acts as lock means releasably connecting the mounting frame to the support frame to allow selective pivoting of the mounting frame on the threaded hinge pins of the other pair of aligned hinges relative to the support frame to provide access to both right and left sides of the mounting frame.

BRIEF DESCRIPTION OF THE DRAWINGS

FIG. 1 is a perspective view of a telecommunications wall rack embodying the herein disclosed invention mounted on a conventional wall;

FIG. 2 is a top view of the telecommunications wall rack shown in FIG. 1;

FIG. 3 is a top view of the telecommunications wall rack of FIG. 1 but showing one side of a mounting frame pivoted away from a support frame;

FIG. 4 is a front elevational view of the telecommunications wall rack of FIG. 1;

FIG. 5 is a side elevational view of the telecommunications wall rack shown in FIG. 1;

FIG. 6 is an enlarged fragmentary front elevational view of a portion of the wall rack of FIG. 1 showing details of construction of a hinge;

FIG. 7 is an enlarged cross sectional view being similar to the arrangement of parts of FIG. 6, but in cross section;

FIG. 8 is a cross sectional view taken on line 8—8 of FIG. 7; and

FIG. 9 is a cross sectional view taken on line 9—9 of FIG. 7.

DESCRIPTION OF THE PREFERRED EMBODIMENT

Referring now to the drawings and especially to FIG. 1, a telecommunications wall rack which is a specific embodiment of the herein disclosed invention is generally indicated by numeral 10. Wall rack 10 is particularly adapted for supporting a plurality of telecommunications panels which are not shown herein. The telecommunications panels are panels, such as, modular jack panels, which are well known in the art. It is believed that showing those panels mounted on the subject wall rack would obscure the construction of the wall rack rather than aid in understanding of the invention.

Wall rack 10 generally includes a support frame 12 which is adapted for mounting on a substantially vertical surface, such as, a conventional wall 14. A mounting frame 16 is mounted on the support frame. The mounting frame is particularly adapted for receiving telecommunications panels, such as, modular jack panels, as mentioned above.

Support frame 12 includes a pair of vertically oriented spaced apart support sides 18 and 20, which are mirror images of each other. Each, in this instance, is made of a single piece of sheet steel formed to the required configuration. Support sides 18 and 20 include side panels 22 and 24, respectively, with openings 26 and 28, respectively. Mounting flanges 30 and 32 are formed integral with panels 22 and 24, respectively. The mounting flanges each have a pair of identical double key hole slots 34 formed therein, each of which slots are adapted to receive a conventional mounting fastener, such as, a screw or toggle bolt, as a particular construction warrants. The particular mounting fastener used for securing the support frame to the wall is not shown herein, in view of the fact that such mounting fasteners are well known in the art.

Side panels 22 and 24 have lower support flanges 36 and 38, respectively, formed integral therewith. Mirror image upper support flanges 40 and 42 are formed integral with panels 22 and 24, respectively. Each of the upper and lower support flanges has a pair of spaced apart boss apertures 44 and 46 formed therein to receive a portion of a hinge.

The support frame includes an upper stabilizing plate 48 connecting the upper portion of the support sides and a lower stabilizing plate 50 connecting the lower portion of the support sides.

Mounting frame 16 includes a pair of opposed frame angle uprights 52 and 54 which are parallel to each other. An upper cross member 56 is fixed to the upper ends of the uprights 52 and 54, and a lower cross member 58 is connected to the lower ends of uprights 52 and 54. A mounting flange 60 is an integral part of upright 52, and a mirror image mounting flange 62 is an integral part of upright 54. Mounting flanges 60 and 62 each have a plurality of drilled and tapped mounting apertures 64, which are arranged in a selected drill pattern depending upon the specific panels which are to be mounted on the mounting flanges, as is well known in the art.

Mounting frame 16 is connected on one side to support frame 12 by a pair of aligned hinges 70 and 72. The other side of the mounting frame is connected to the other side of the support frame by a pair of aligned hinges 74 and 76. Hinge 70 is connected to the upper portion of one side of the frame, and hinge 72 is connected to the lower portion of the same side of the mounting frame. The axes of pivoting of hinges 70 and 72 are aligned. Hinge 74 is connected to the upper edge of the other side of the mounting frame, and hinge 76 is connected to the lower edge of the other side of the mounting frame. The axes of pivoting of hinges 74 and 76 are aligned.

The construction of each of hinges 70, 72, 74 and 76 is identical. Accordingly, the details of construction of only hinge 72 is shown in FIG. 6, 7, 8 and 9. Hinge 72 includes a hinge threaded aperture 82 in cross member 58 of the mounting frame.

Hinge 72 includes a double nut 86. Double nut 86 includes a planar body 88 with a pair of bosses 90 and 92 integral with body 88. Bosses 90 and 92 are mounted in apertures 44 and 46, respectively. The double nut includes internally threaded apertures 94 and 96 extending through bosses 90 and 92, respectively. Double nut 86 is fixed to lower support flange 36 by spot welding at a pair of weld spots 98.

Hinge 72 includes a conventional hex head machine screw 100, which extends through a screw aperture 102 in lower stabilizing plate 50 and is a threaded hinge pin for the hinge. Screw 100 has a threaded portion 104 which is threadedly mounted in threaded aperture 96 of the double nut and hinge threaded aperture 82 of lower cross member 58. Screw 100 has a conventional head 106 which is jammed against the lower stabilizing plate of the support frame to prevent the screw from loosening. Machine screw 100 of hinge 72 is axially aligned with a like conventional machine screw 108 of hinge 70 so that the hinges have aligned axes of pivoting since their respective threaded hinge pins are aligned.

In a like manner to hinges 70 and 72, hinges 74 and 76 have aligned axes of pivoting. Conventional machine screws 110 and 112, which are the threaded hinge pins, of hinges 74 and 76, respectively, are identical to machine screw 100, and are aligned with each other, as are machine screws 100 and 108.

Machine screws 110 and 112 may be readily moved from engagement from their respective hinge threaded apertures in the upper and lower cross members. This allows the support frame 16 to pivot on the threaded portions of screws 100 and 108. The space between each cross member and the respective double nut 86 is at least 3/16 of an inch (0.476 cm).

The space between the cross member and the double nut allows the support frame to move axially along the threaded portion of the machine screws. When the mounting frame is pivoted from a position substantially parallel to the stabilizer plates to an attitude where the mounting frame is substantially perpendicular to the stabilizer plates, the mounting frame moves axially along the threaded portions of the screw one quarter of the pitch of the threads of the threaded portion. When the mounting frame is pivoted to the attitude perpendicular to the stabilizer plates, the back or interior side of the mounting frame is available. It is readily apparent that any panels mounted on the mounting frame would thus have their backside exposed for installation or repair.

The mounting frame is moved into its stable or locked attitude by pivoting the frame to its attitude substantially parallel to the stabilizer plates and the screws 110 and 112 are threadedly repositioned in their respective hinge threaded apertures. Thus, the hinges act as a releasable locking means to allow the mounting frame to pivot on the aligned hinges on the opposite side of the frame.

The operation of the mounting frame has been described wherein screws 110 and 112 have been disengaged from their respective hinge threaded apertures. Screws 108 and 100 may be disengaged from their respective hinge threaded apertures, so that the mounting frame pivots on screws 110 and 112 of hinges 74 and 76, respectively.

Irrespective of whether the mounting frame is pivoting on one side or the other, the mounting frame is always pivoting on the threaded portions of the screws which eliminates substantial sag of the mounting frame, so that the mounting frame loaded with modular jack panels and appropriate wiring may be readily and conveniently pivoted outward and then readily replaced to its operative position. Thus, there is a no sag in the construction of the present wall rack which greatly facilitates the utilization of the wall rack.

As may be best seen in FIG. 9, a fastener 114 is threadedly mounted in threaded aperture 94 of the double nut 96. Fastener 114 is a conventional machine screw which is positioned in a screw aperture 116 in lower stabilizing plate 50. Fastener 114 includes a threaded portion 118 and a head 120. There is a like construction with each of the hinges, wherein a fastener 114 is mounted in each of the double nuts. When the fastener 114 is in position, the fastener in cooperation with the respective machine screw holds the support side substantially perpendicular to the stabilizer plates. By removing the fasteners 114, the support sides may be pivoted on their respective hinges until the support sides are collapsed into an attitude adjacent to the stabilizer plates. The collapsed attitude of the support sides allows the instant wall rack to be shipped within a minimum of space. Upon arrival at destination, it is a simple matter to pivot the two support sides to an attitude, wherein the support sides are parallel to each other. Fasteners 114 are inserted in the double nuts and tightened to provide a stable rigid construction, wherein the sides are parallel to each other and perpendicular to the stabilizer plates. The wall rack may then be easily mounted on a surface, such as, a wall by securing mounting fasteners to the wall and then positioning the mounting fasteners in the double key holes 34 of the mounting flanges. Once the wall rack is mounted, panels are mounted on the mounting frame, as is conventional.

Although a specific embodiment of the herein disclosed invention has been described in detail above, it is readily apparent that those skilled in art may make various modifications and changes without departing from the spirit and scope of the present invention. It is to be expressly understood that the scope of this invention is limited only by the appended claims.

I claim:

1. A telecommunications wall rack for use in supporting a plurality of telecommunications panels comprising; a support frame adapted for mounting on a substantially vertical surface, a mounting frame having first and second sides and adapted for supporting a plurality of telecommunications panels, a pair of aligned hinges pivotally connecting said mounting frame to the support frame, each of said hinges having an axis of pivoting substantially aligned with the axis of pivoting of the other hinge of the pair, each of said hinges having a threaded hinge pin mounted on the support frame, each threaded hinge pin having a threaded portion, said mounting frame being threadedly connected to the support frame through the threaded portion of each hinge pin to pivot on the threaded portion of the hingepins, each hinge includes a double nut fixed to the support frame, each hinge pin is a screw having its threaded portion threadedly mounted in a portion of the double nut, and each screw has a head jammed against a portion of the support frame providing lock means releasably connecting the mounting frame to the support frame to allow selective pivoting of the mounting frame on the threaded hinge pins relative to the support frame to provide access to both sides of the mounting frame.

2. A telecommunications wall rack for use in supporting a plurality of telecommunications panels comprising; a support frame adapted for mounting on a substantially vertical surface, a mounting frame having first and second sides adapted for supporting a plurality of telecommunications panels, a pair of aligned hinges pivotally connecting said mounting frame to the support frame, each of said hinges having an axis of pivoting substantially aligned with the axis of pivoting of the other hinge of the pair, each of said hinges having a threaded hinge pin mounted on the support frame, each threaded hinge pin having a threaded portion, said mounting frame being threadedly connected to the support frame through the threaded portion of each hinge pin to pivot on the threaded portion of the hinge pins the support frame includes a pair of spaced apart support sides, each hinge includes a double nut welded to a respective support side and a hinge threaded aperture in the mounting frame, each hinge pin is a screw threadedly mounted in the double nut and having a head jammed against a portion of the support frame, each double nut threadedly receives a respective screw to allow the mounting frame to pivot on the hinge pins, and lock means releasably connecting the mounting frame to the support frame to allow selective pivoting of the mounting frame on the threaded hinge pins relative to the support frame to provide access to both sides of the mounting frame.

3. A telecommunications wall rack for use in supporting a plurality of telecommunications panels comprising; a support frame adapted for mounting on a substantially vertical surface, a mounting frame having first and second sides and adapted for supporting a plurality of telecommunications panels, a pair of aligned hinges pivotally connecting said mounting frame to the support frame, each of said hinges having an axis of pivoting substantially aligned with the axis of pivoting of the other hinge of the pair, each of said hinges having a threaded hinge pin mounted on the support frame, each threaded hinge pin having a threaded portion, said mounting frame being threadedly connected to the support frame through the threaded portion of each hinge pin to pivot on the threaded portion of the hinge pins, said support frame includes a pair of vertically oriented spaced apart support sides, said support sides being substantially parallel to each other, an elongated upper stabilizer plate having one end connected to one of said support sides and an opposite end connected to the other of said support sides, and an elongated lower stabilizer plate having one end connected to one of said support sides and an opposite end connected to the other of said support sides; and each hinge including a double nut fixed to a respective support side, each hinge pin being a screw having its threaded portion threadedly mounted in a portion of the double nut and a head jammed against a respective stabilizer plate providing lock means releasably connecting the mounting frame to the support frame to allow selective pivoting of the mounting frame on the threaded hinge pins relative to the support frame to provide access to both sides of the mounting frame.

4. A telecommunications wall rack for use in supporting a plurality of telecommunications panels comprising; a support frame adapted for mounting on a substantially vertical surface, a mounting frame having first and second sides and adapted for supporting a plurality of telecommunications panels, a pair of aligned hinges pivotally connecting said mounting frame to the support frame, each of said hinges having an axis of pivoting substantially aligned with the axis of pivoting of the other hinge of the pair, each of said hinges having a threaded hinge pin mounted on the support frame, each threaded hinge pin having a threaded portion, said mounting frame being threadedly connected to the support frame through the threaded portion of each hinge pin to pivot on the threaded portion of the hinge pins, said support frame includes a pair of vertically oriented spaced apart support sides, said support sides being substantially parallel to each other, an elongated upper stabilizer plate having one end connected to one of said support sides and an opposite end connected to the other of said support sides, and an elongated lower stabilizer plate having one end connected to one of said support sides and an opposite end connected to the other of said support sides; each hinge including a double nut fixed to a respective support side, each threaded pin being a screw having its threaded portion threadedly mounted in a portion of the double nut and a head jammed against a portion of its respective stabilizer plate providing lock means releasably connecting the mounting frame to the support frame to allow selective pivoting of the mounting frame on the threaded hinge pin relative to the support frame to provide access to both sides of the mounting frame, and a fastener screw releasably connecting the end of each of the stabilizer plates to its respective support side.

5. A telecommunications wall rack for use in supporting a plurality of telecommunications panels comprising; a support frame adapted for being mounted on a substantially vertical surface, a mounting frame adapted for supporting a plurality of telecommunications panels, said mounting frame having one side connected to the support frame by a pair of aligned hinges, said mounting frame having an opposite side connected to the support frame by a second pair of aligned hinges substantially parallel in alignment to the first-mentioned pair of aligned hinges, each of said hinges having a threaded hinge pin mounted in the support frame, each threaded hinge pin having a threaded portion, each of said threaded hinge pins being threadedly removably mounted in the mounting frame supporting the mounting frame, each hinge includes a double nut fixed to the support frame, each hinge pin is a screw having its threaded portion threadedly mounted in a portion of the double nut and a head jammed against a portion of the support frame, the hinge pins of each pair of aligned hinges being aligned, whereby removal of the hinge pins of one the pairs of aligned hinges from the mounting frame allows the mounting frame to pivot on the threaded portion of the hinge pins of the other pair of aligned hinges.

6. A telecommunications wall rack for use in supporting a plurality of telecommunications panels comprising; a support frame adapted for being mounted on a substantially vertical surface, a mounting frame adapted for supporting a plurality of telecommunications panels, said mounting frame having one side connected to the support frame by a pair of aligned hinges, said mounting frame having an opposite side connected to the support frame by a second pair of aligned hinges substantially parallel in alignment to the first-mentioned pair of aligned hinges, each of said hinges having a threaded hinge pin mounted in the support frame, each threaded hinge pin having a threaded portion, each of said threaded hinge pins being threadedly removably mounted in the mounting frame supporting the mounting frame, the support frame includes a pair of spaced apart support sides, and said support sides being parallel to each other; and each hinge includes a double nut welded to a respective support side, a hinge threaded aperture in the mounting frame, and said hinge pin is a screw threadedly mounted in the double nut, said screw including a head jammed against a portion of the support frame, each hinge threaded aperture threadedly receives the respective screw to allow the mounting frame to pivot on the hinge pins, the hinge pins of each pair of aligned hinges being aligned, whereby removal of the hinge pins of one of the pairs of aligned hinges from the mounting frame allows the mounting frame to pivot on the threaded portion of the hinge pins of the other pair of aligned hinges.

7. A telecommunications wall rack for use in supporting a plurality of telecommunications panels comprising; a support frame adapted for being mounted on a substantially vertical surface, a mounting frame adapted for supporting a plurality of telecommunications panels, said mounting frame having one side connected to the support frame by a pair of aligned hinges, said mounting frame having an opposite side connected to the support frame by a second pair of aligned hinges substantially parallel in alignment to the first-mentioned pair of aligned hinges, said support frame includes a pair of substantially vertically spaced apart support sides, said support sides being substantially parallel to each other, an elongated upper stabilizer plate having one end connected to one of said support sides and an opposite end connected to the other of said support sides, an elongated lower stabilizer plate having one end connected to one of said support sides and an opposite end connected to the other of said support sides and each hinge includes a double nut fixed to its respective support side, each of said hinges having a threaded hinge pin mounted in the support frame, each of said threaded hinge pins being threadedly removably mounted in the mounting frame supporting the mounting frame, each hinge pin is a screw having its threaded portion threadedly mounted in a portion of the double nut and a head jammed against its respective stabilizer plate, the hinge pins of each pair of aligned hinges being aligned, whereby removal of the hinge pins of one of the pairs of aligned hinge pins from the mounting frame allows the mounting frame to pivot on the threaded portion of the hinge pins of the other pair of aligned hinges.

8. A telecommunications wall rack for use in supporting a plurality of telecommunications panels comprising; a support frame adapted for being mounted on a substantially vertical surface, a mounting frame adapted for supporting a plurality of telecommunications panels, said mounting frame having one side connected to the support frame by a pair of aligned hinges, said mounting frame having an opposite side connected to the support frame by a second pair of aligned hinges substantially parallel in alignment to the first-mentioned pair of aligned hinges, each of said hinges having a threaded hinge pin mounted in the support frame, each threaded hinge pin having a threaded portion, each of said threaded hinge pins being threadedly removably mounted in the mounting frame supporting the mounting frame, said support frame includes, a pair of vertically oriented spaced apart support sides, said support sides being substantially parallel to each other, an elongated upper stabilizer plate having one end connected to one of said support sides and an opposite end connected to the other of said support sides, and an elongated lower stabilizer plate having one end connected to one of said support sides and an opposite end connected to the other of said support sides; each hinge includes a double nut welded to its respective support side and a hinge threaded aperture in the mounting frame, each hinge pin is a screw threadedly mounted in the double nut and having a head jammed against its respective stabilizer plate, the hinge pins of each pair of aligned hinges being aligned, whereby removal of the hinge pins of one of the pairs of aligned hinges from the mounting frame allows the mounting frame to pivot on the threaded portion of the hinge pins of the other pair of aligned hinges, and each hinge threaded aperture removably threadedly receiving its respective screw; and a fastener releasably connecting each of the ends of each of the stabilizer plates to its respective support side to hold the support sides substantially perpendicular to the stabilizer plates, whereby removal of the fasteners allows the support sides to be pivoted relative to the stabilizer plates to a collapsed attitude.

* * * * *

UNITED STATES PATENT AND TRADEMARK OFFICE
CERTIFICATE OF CORRECTION

PATENT NO. : 5,540,339
DATED : July 30, 1996
INVENTOR(S) : Zev Z. Lerman

It is certified that error appears in the above-indentified patent and that said Letters Patent is hereby corrected as shown below:

Claim 1, Column 5, Line 17, delete "hingepins" and substitute therefor --hinge pins--

Claim 2, Column 5, Line 31, after "sides" insert -- and --

Claim 2, Coumn 5, Line 40, after "pins" insert -- , --

Claim 7, Column 8, Line 8, cancel the second recitation of the word "hinge" and substitute therefor --hinges--

Claim 7, Column 8, Line 9, cancel the word "pins"

Signed and Sealed this

Fifteenth Day of October, 1996

Attest:

BRUCE LEHMAN

Attesting Officer     Commissioner of Patents and Trademarks